United States Patent [19]

Nishikawa et al.

[11] Patent Number: 5,610,447
[45] Date of Patent: Mar. 11, 1997

[54] WIRE HARNESS AND METHOD OF MANUFACTURING THE SAME

[75] Inventors: Yasuo Nishikawa; Hiroyuki Nakajima; Hitoshi Iwata; Yoshihiro Kumazawa; Naohito Sawamura; Hiroshi Nakamura; Ichiro Suzuki; Shigeru Kobayashi; Ryuichi Nabeshima; Takao Sakashita, all of Mie-ken; Kazuhiko Okino, Iwate-ken; Kiyoshi Taira, Iwate-ken; Koukichi Takamura, Iwate-ken; Mitsuyoshi Omaki, Iwate-ken, all of Japan

[73] Assignee: Sumitomo Wiring Systems, Ltd., Mie-ken, Japan

[21] Appl. No.: 77,035

[22] Filed: Jun. 16, 1993

[30] Foreign Application Priority Data

Jun. 17, 1992 [JP] Japan ................. 4-158196

[51] Int. Cl.$^6$ ................. H02B 1/04; H02B 1/20
[52] U.S. Cl. ................. 307/38; 361/826; 459/34; 29/755; 174/72 A
[58] Field of Search ................. 361/826, 827; 307/9.1, 10.1, 12, 148, 38; 439/34, 505; 29/857, 335, 755, 863; 174/72 A, 72 R, 71 R

[56] References Cited

U.S. PATENT DOCUMENTS

| | | | |
|---|---|---|---|
| 3,683,197 | 8/1972 | Ives | 307/10.1 |
| 3,952,209 | 4/1976 | Shaklee et al. | 307/10.1 |
| 4,280,062 | 7/1981 | Miller et al. | 174/72 A |
| 4,831,726 | 5/1989 | Moly | 29/857 |
| 4,942,499 | 7/1990 | Shibata et al. | 174/72 A |
| 4,942,571 | 7/1990 | Möller et al. | 307/10.1 |

FOREIGN PATENT DOCUMENTS

| | | |
|---|---|---|
| 0038861A | 11/1981 | European Pat. Off. |
| 1283708 | 11/1989 | Japan |
| 1177275 | 1/1970 | United Kingdom |
| 2050709 | 1/1981 | United Kingdom |

Primary Examiner—William M. Shoop, Jr.
Assistant Examiner—Peter Ganjoo
Attorney, Agent, or Firm—Sughrue, Mion, Zinn, Macpeak & Seas

[57] ABSTRACT

A wire harness for an appliance containing a combination of selectable electrical systems is separated into a common circuit which is always provided independently of presence or absence of the selectable electrical systems, and dedicated circuits one for each of the selectable electrical systems, the common circuit and the dedicated circuits of the selected electrical systems are detachably joined to each other via a branch connector to form the wire harness whereby simple production control and high production efficiency are assured and changes in production or design can be readily dealt with in the production of a wire harness.

15 Claims, 9 Drawing Sheets

Fig. 3A
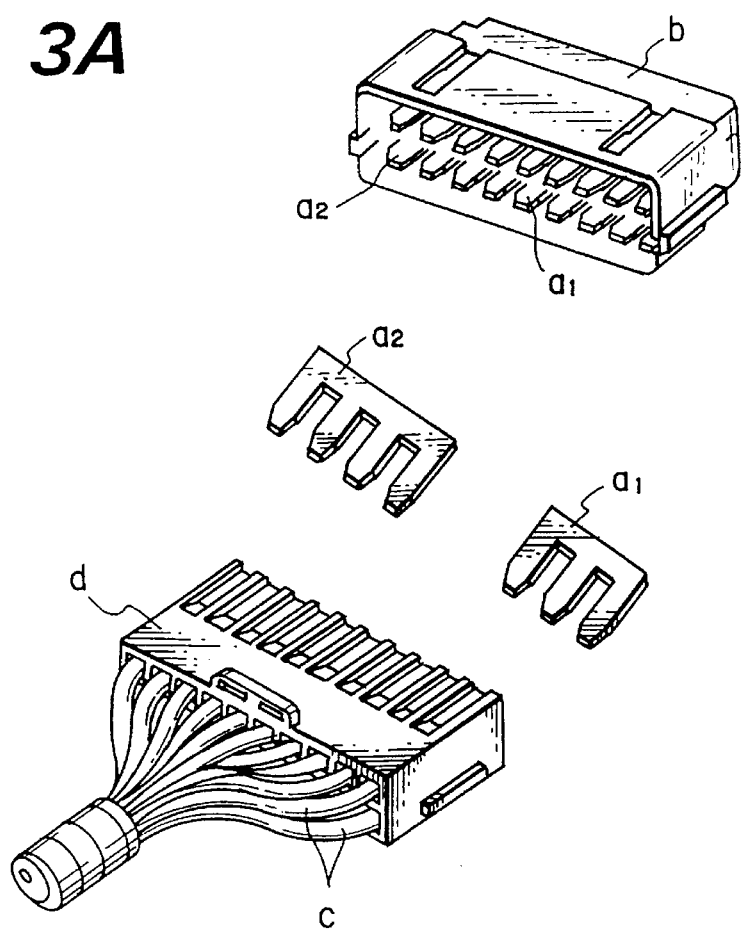
Fig. 3B
Fig. 3C
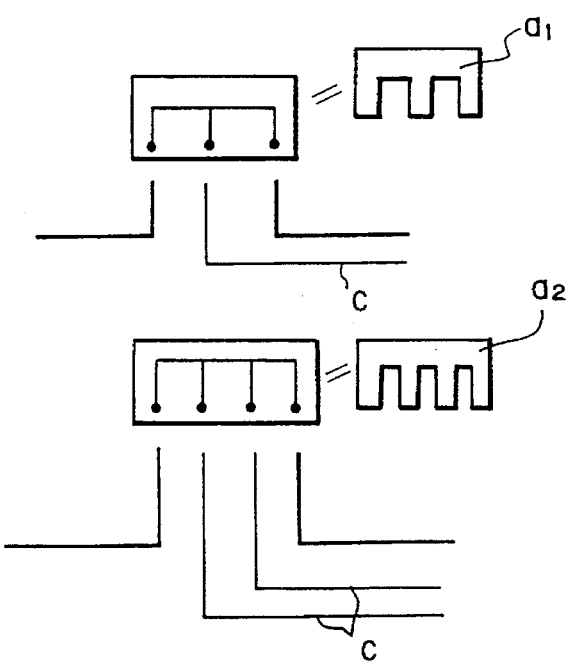

WIRE HARNESS AND METHOD OF MANUFACTURING THE SAME

BACKGROUND OF THE INVENTION

1. Field of the Invention

The present invention relates to a wire harness for use in vehicles or industrial or household appliances and a method for manufacturing thereof.

2. Prior Art

A wire harness, for example, for a vehicle comprises many sections, including an engine compartment harness, a main harness, a cabin harness, a front door harness and so on. The circuitry of each of these harness sections differs depending on the car model, engine model, door model (hereinafter referred to as a car model), the grade or specification. A harness number is assigned to each of the different circuits of different harness sections. That is, production control and manufacture of the wire harness are conducted for each of these harness numbers. For example, assuming that the main harness of a certain car model contains, in addition to the basic or normally installed equipment such as a radio, air conditioner, and a trunk compartment lamp, some of four selectable electrical systems, including a four wheel drive system, an electronic control suspension system, an anti-lock braking system and a keyless entry system (a system in which the car door can be opened/closed by means of a card), 16 different harness numbers are required to cover all possible combinations of these four electrical systems. This applies not only to the main harness but also to each of the other harness sections, including an engine compartment harness, cabin harness, and front door harness. Further, there are 16 different harness numbers for every harness section of every car model. The wire harness for a single vehicle is constituted of a combination of harnesses bearing particular harness numbers of respective harness sections which are determined by a combination of selected electrical systems.

However, there is a tendency toward an increase in the number of harness numbers due to diversification of car models, grades or specifications, and thus there is a tendency towards small-scale varieted production of wire harnesses, making production control difficult. That is, an increase in the number of harness numbers makes production control of a wire harness troublesome and mass production impossible, thereby resulting in a decrease in productivity. Furthermore, since a wire harness is manufactured corresponding to each of harness numbers, when a variation in the production quantity of a harness occurs, manufacture of the entire harness section must be corrected to re-adjust the production quantity, thus making the manufacture difficult. Particularly, in the case of wire harnesses for vehicles, a change in the combination of electrical systems brings about a change not only in a single harness section but also in the harness numbers of all the other harness sections, making the manufacture difficult. Furthermore, when a change in design occurs, the manufacture of the entire harness circuit must be corrected to adjust the circuit configuration, making manufacture difficult.

SUMMARY OF THE INVENTION

In view of the aforementioned problems of the prior art, a primary object of the present invention is to provide a wire harness which assures easy production control and high productivity, and which allows changes in production or design to be readily dealt with.

A second object of the present invention is to provide a method of manufacturing a wire harness which assures high productivity and can readily deal with changes in production or design.

To achieve the above-described primary object, the present invention provides a wire harness for an appliance which contains a combination of selectable electrical systems. The wire harness comprises a common circuit provided independently of the presence or absence of the selectable electrical systems, and dedicated circuits one for each of the selectable electrical systems, the dedicated circuits being separated from the common circuit. The common circuit and the dedicated circuits of the selected electrical systems are detachably joined to each other via a branch connector.

The branch connector allows easy connection of the dedicated circuits to the common circuit while maintaining the connection of the common circuit to other portions unchanged and includes a joint connector, junction box, junction block and the like.

To achieve the second object, the present invention provides a method of manufacturing a wire harness for equipment the circuit of which differs depending on a combination of selectable electrical systems, which comprises the steps of separately forming a common circuit, which is always contained independently of the presence or absence of the selectable electrical systems, and dedicated circuits one for each of the selectable electrical systems, and detachably joining the common circuit and the dedicated circuits of the selected electrical systems on a plurality of working tables using a branch connector.

In the wire harness, the circuit configuration differs depending on a combination of selectable electrical systems which in turn depends on the grade, specification or the like. Thus, a desired wire harness can be readily formed by being divided into a common circuit, which is contained independently of the presence or absence of the selectable electrical systems, and dedicated circuits one for each of the selectable electrical systems, and by detachably joining the common circuit and the dedicated circuits of the selected electrical systems using a branch connector.

Furthermore, the common circuit and the dedicated circuits one for each of the electrical systems have a small circuit unit, and thus can be readily assembled on a continuously moving working table, making mass production of the wire harness on a production line, such as a conveyor, possible.

Furthermore, since production control and manufacture of a wire harness are performed not for each of the harness numbers which differ depending on a combination of electrical systems but for each of the common circuit and dedicated circuits for the selectable electrical systems, the number of harnesses to be production controlled is reduced, making manufacture and production control easy. Also, since the common circuit and the dedicated circuits one for each of the selectable electrical systems are all the products to be produced, the production lot can be increased, making mass production possible.

Furthermore, changes in production quantity can be dealt with simply by changing the combination of the dedicated circuits for the electrical systems which constitute a part of the wire harness, making changes in production quantity easy.

Furthermore, changes in design can be dealt with simply by changing the dedicated circuits of the electrical systems of an appliance or equipment to be changed, making changes in design easy.

The above and other objects, features and advantages of the present invention will become more apparent from the following description when taken in conjunction with the accompanying drawings in which a preferred embodiment of the present invention is shown by way of illustrative examples.

BRIEF DESCRIPTION OF THE DRAWINGS

FIG. 3(a) is a perspective view showing the structure of a joint connector used for connection between the common circuit and the dedicated circuits according to the present invention;

FIGS. 3(b) and 3(c) are diagrams showing the internal circuits of the joint connector;

PREFERRED EMBODIMENT OF THE INVENTION:

An embodiment of the present invention will now be described with reference to the accompanying drawings.

Figure 1:
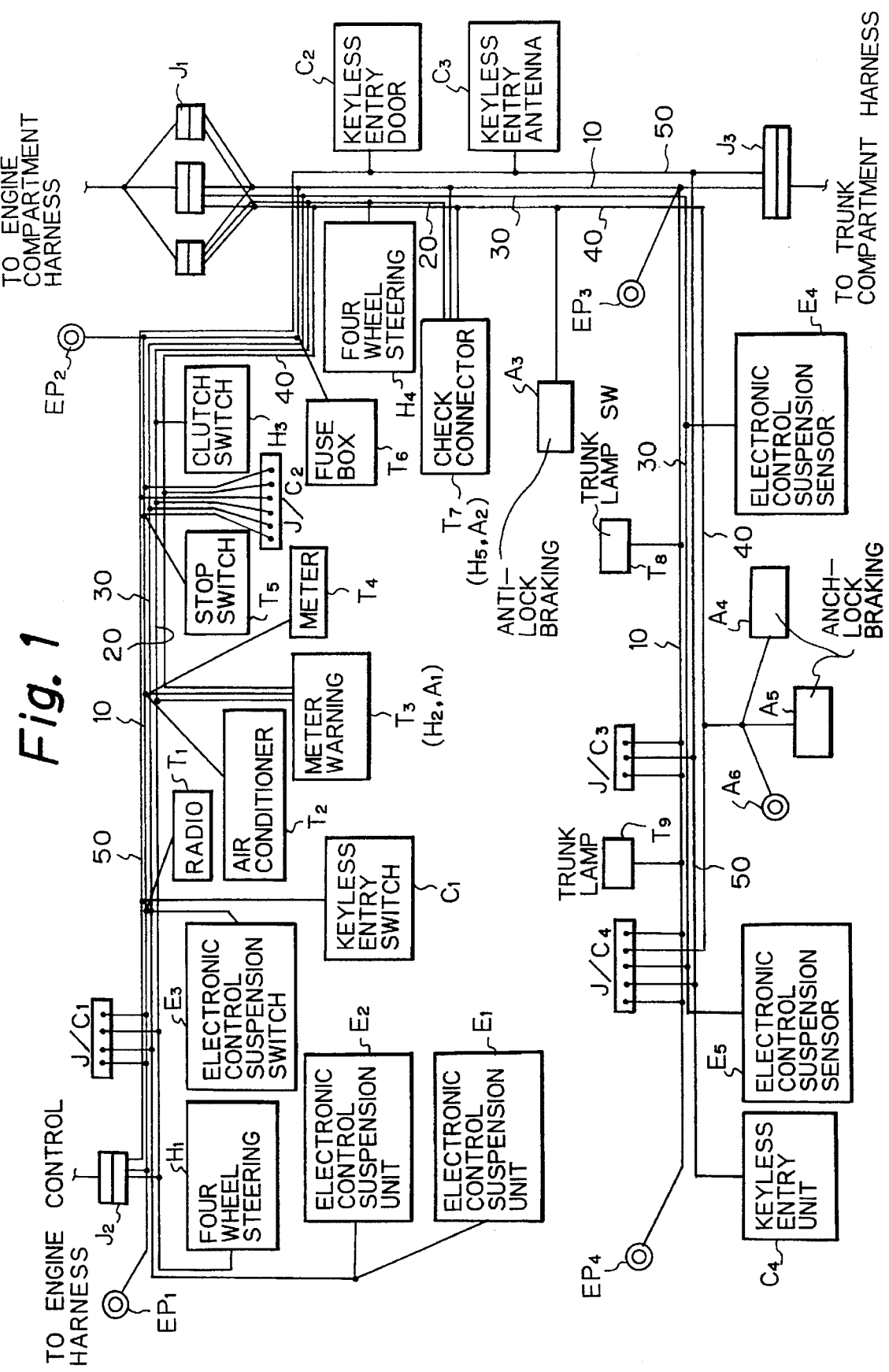
FIG. 1 illustrates, together with the electrical systems, an example of the wiring structure of a main harness for a vehicle according to the present invention.

FIG. 1 illustrates, together with associated electrical equipment, a wiring structure of a main harness for a vehicle to which the present invention is applied.

In the FIG. $J_1$ designates a connector for connecting the main harness to an engine compartment harness (not shown), $J_2$ designates a connector for connecting the main harness to an engine control harness (not shown), $J_3$ designates a connector for connecting the main harness to a trunk compartment harness (not shown), and $EP_1$ through $EP_4$ designate grounding points.

The main harness shown in FIG. 1 is for a vehicle which incorporates, as selectable electrical systems, a four wheel drive system, an electronic control suspension system, an anti-lock braking system, and a keyless entry system.

The main harness includes, a common circuit 10, which is always provided independently of the presence or absence of a four wheel drive system, the electronic control suspension system, anti-lock braking system or keyless entry system, and independent dedicated circuits 20, 30, 40 and 50 respectively provided for those electrical systems.

Figure 2:
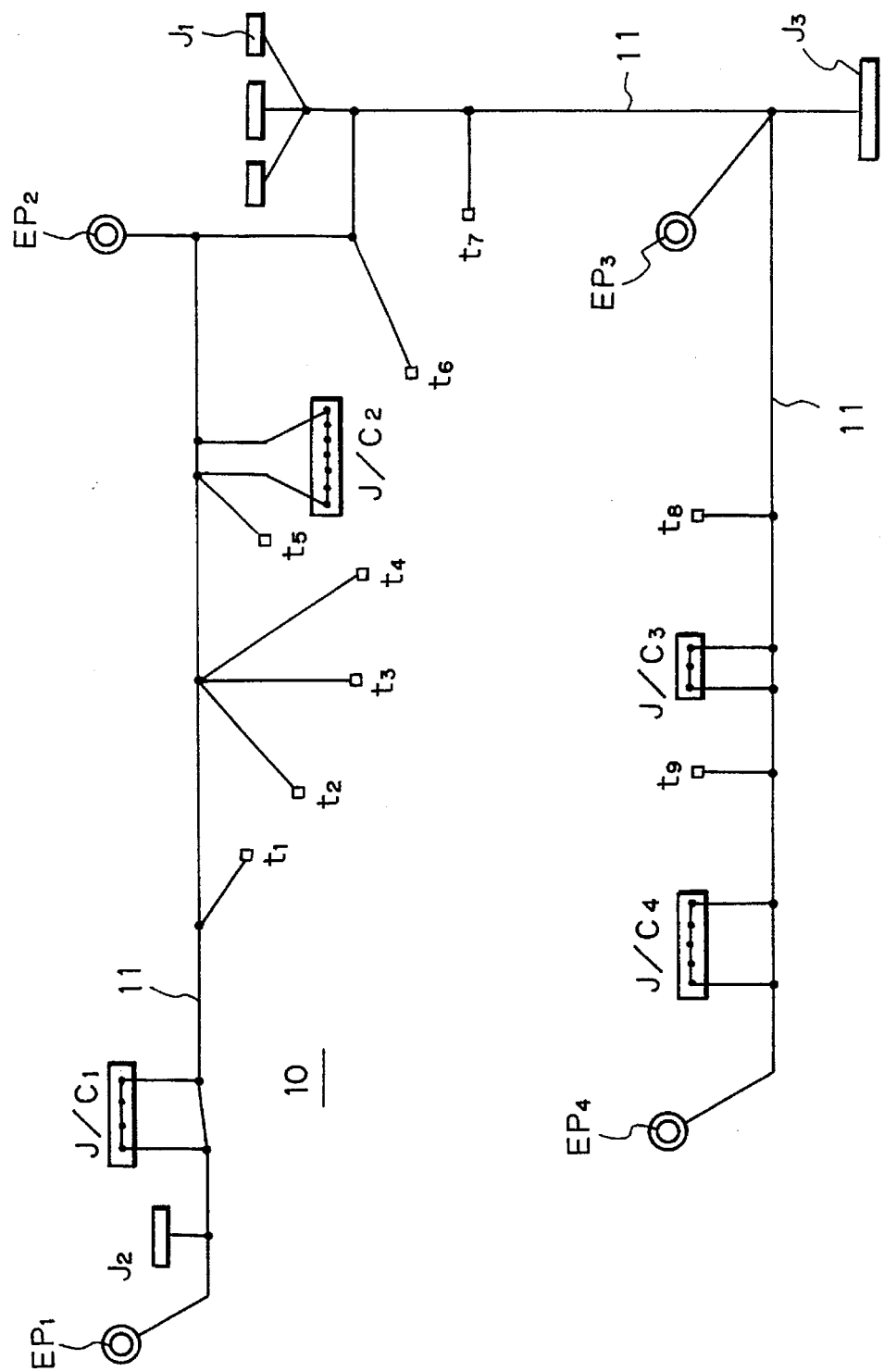
FIG. 2 is a wiring diagram of a common circuit which constitutes the main harness.

As shown in FIG. 2, the common circuit 10 includes a circuit group 11 having a power source circuit, a grounding circuit and signal circuits for the normally-installed electrical equipment, the connector $J_1$ to be connected to the engine compartment harness, $J_2$ to be connected to the engine control harness, $J_3$ to be connected to the trunk compartment harness, the grounding points $EP_1$ through $EP_4$, and terminals $t_1$ through $t_9$ to be connected to the normally-installed electrical equipment $T_1$ through $T_9$, including a radio, an air conditioner, a meter and so on. The connectors $J_1$, $J_2$, $J_3$, the grounding points $EP_1$ through $EP_4$ and the terminals $t_1$ through $t_9$ are connected to the corresponding circuits in the circuit group 11.

In the power circuit and the grounding circuit of the circuit group 11 are interposed joint connectors $J/C_1$ through $J/C_4$. The joint connector J/C has the function of making terminals of the dedicated circuits readily connected to the main circuit while maintaining the connection of the main circuit to other portions unchanged. In a practical structure, as shown in FIG. 3(a), the joint connector J/C includes a connector housing b which contains a large number of connector terminals a1, a2, and a connector member d which laces or bundles terminals c from the dedicated circuits of the respective electrical systems and terminals c from the common circuit and which can be inserted into the connector housing b by one step. FIG. 3(b) shows connection of one of the terminals c from the dedicated circuits to the terminals c of the common circuit. FIG. 3(c) shows connection of two terminals c to the terminals c of the common circuit. The dedicated circuit for each of the electrical systems can be readily connected to the power source circuit and grounding circuit of the common circuit by one-step inserting the terminals c from each of the electrical systems and terminals c from the common circuit into the connector member d and then by inserting the connector member d into the connector housing b.

Figure 4:
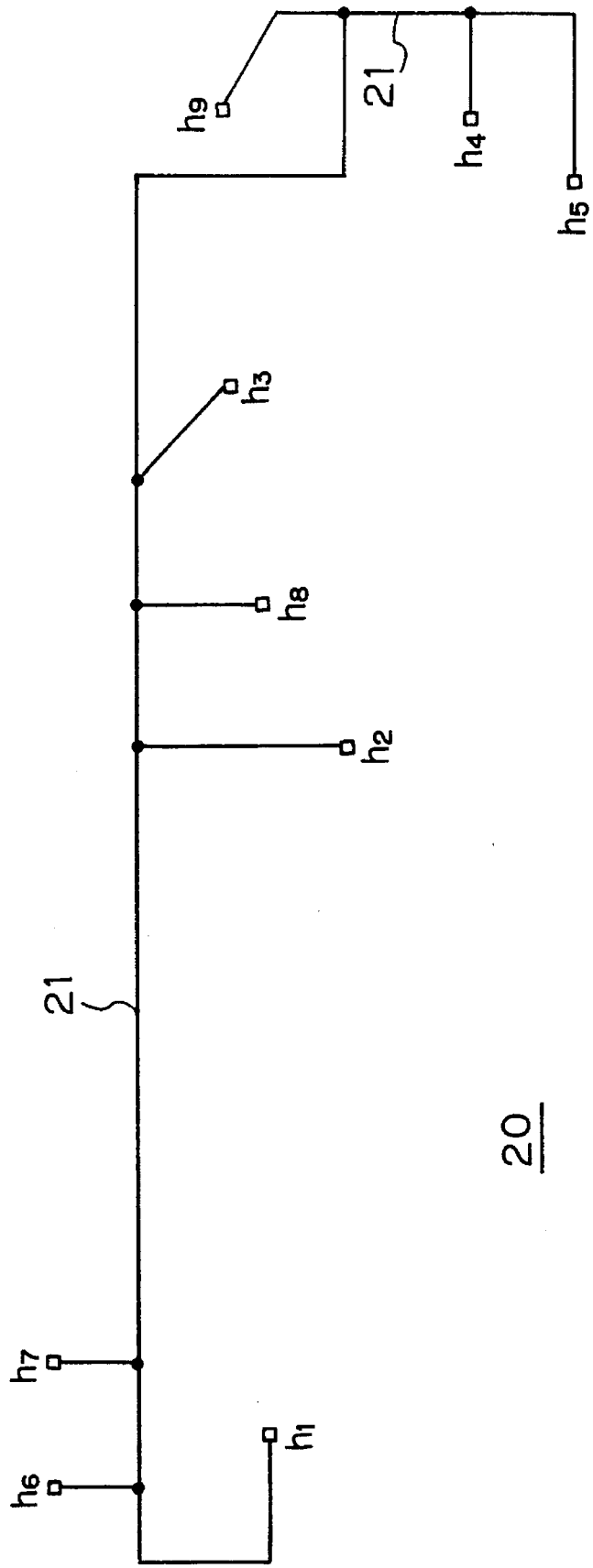
FIG. 4 is a wiring diagram of a four wheel steering system which constitutes the main harness.

As shown in FIG. 4, the dedicated circuit 20 for the four wheel drive system includes: a circuit group 21 having a power source circuit, a grounding circuit and a system signal circuit; terminals $h_1$ through $h_5$ to be inserted into devices $H_1$ through $H_5$ which are associated with a four wheel drive system, including a four wheel drive unit, a four wheel drive switch, an alarm lamp and so on which are connected to the corresponding circuits in the circuit group 21; a terminal $h_6$ to be inserted into the connector $J_2$ which in turn to be joined to the engine control harness; a terminal $h_7$ to be inserted into $J/C_1$; a terminal $h_8$ to be inserted into $J/C_2$; and a terminal $h_9$ ; to be inserted into the connector $J_1$ which in turn to be joined to the engine compartment harness.

Figure 5:
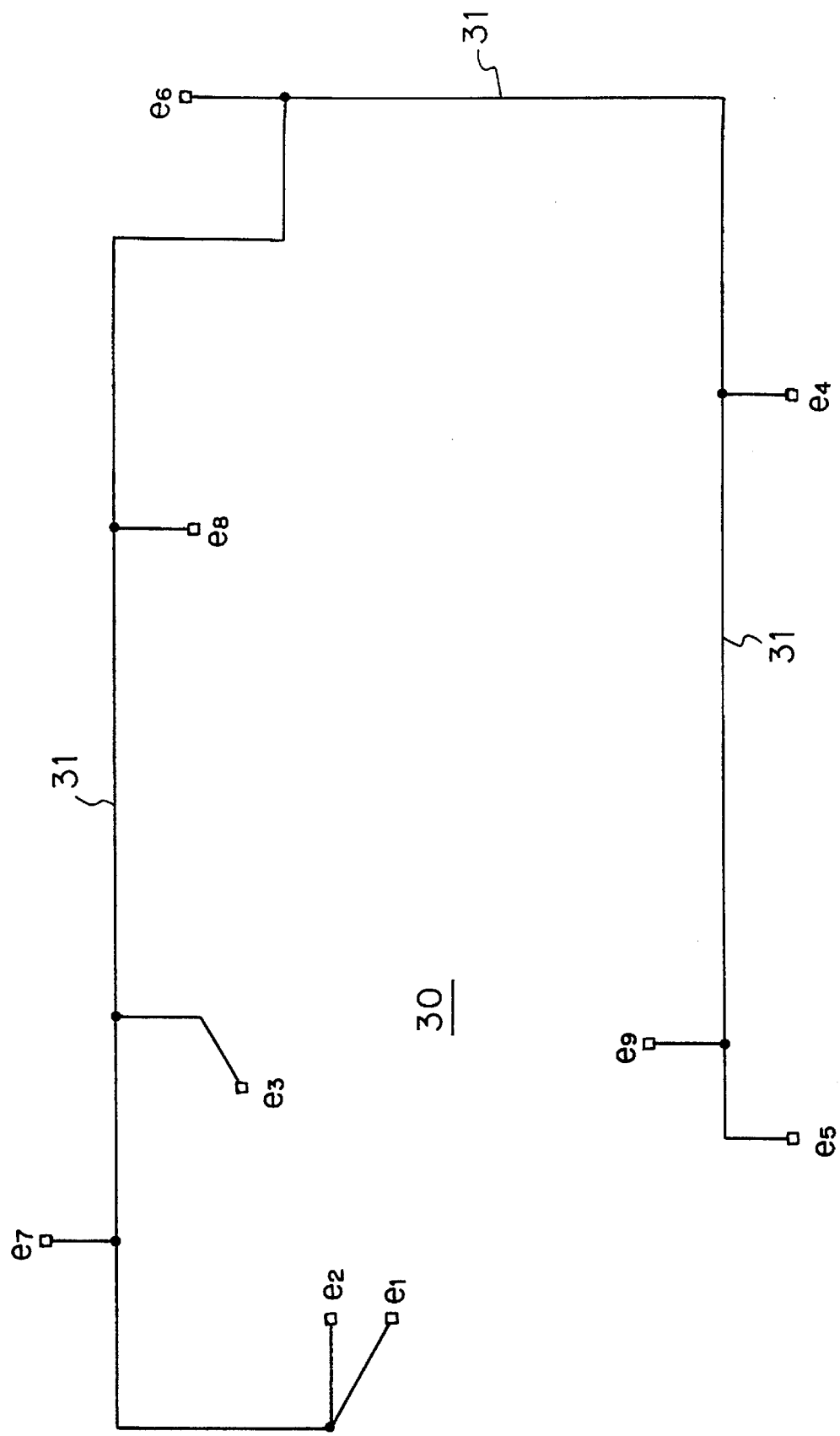
FIG. 5 is a wiring diagram of an electronic control suspension system which constitutes the main harness.

As shown in FIG. 5, the dedicated circuit 30 for the electronic control suspension system includes: a circuit group 31 having a power source circuit, a grounding circuit, and a system signal circuit; terminals $e_1$ through $e_5$ to be inserted into devices $E_1$ through $E_5$ which are associated with the electronic control suspension system, including an electronic control suspension unit, an electronic control suspension switch, an electronic control suspension sensor and so on which are connected to the corresponding circuits in the circuit group 31; a terminal $e_6$ to be inserted into the connector $J_1$ which in turn to be joined to the engine compartment harness; a terminal $e_7$ to be inserted into $J/C_1$; a terminal $e_8$ to be inserted into $J/C_2$; and a terminal $e_9$ to be inserted into $J/C_4$.

Figure 6:
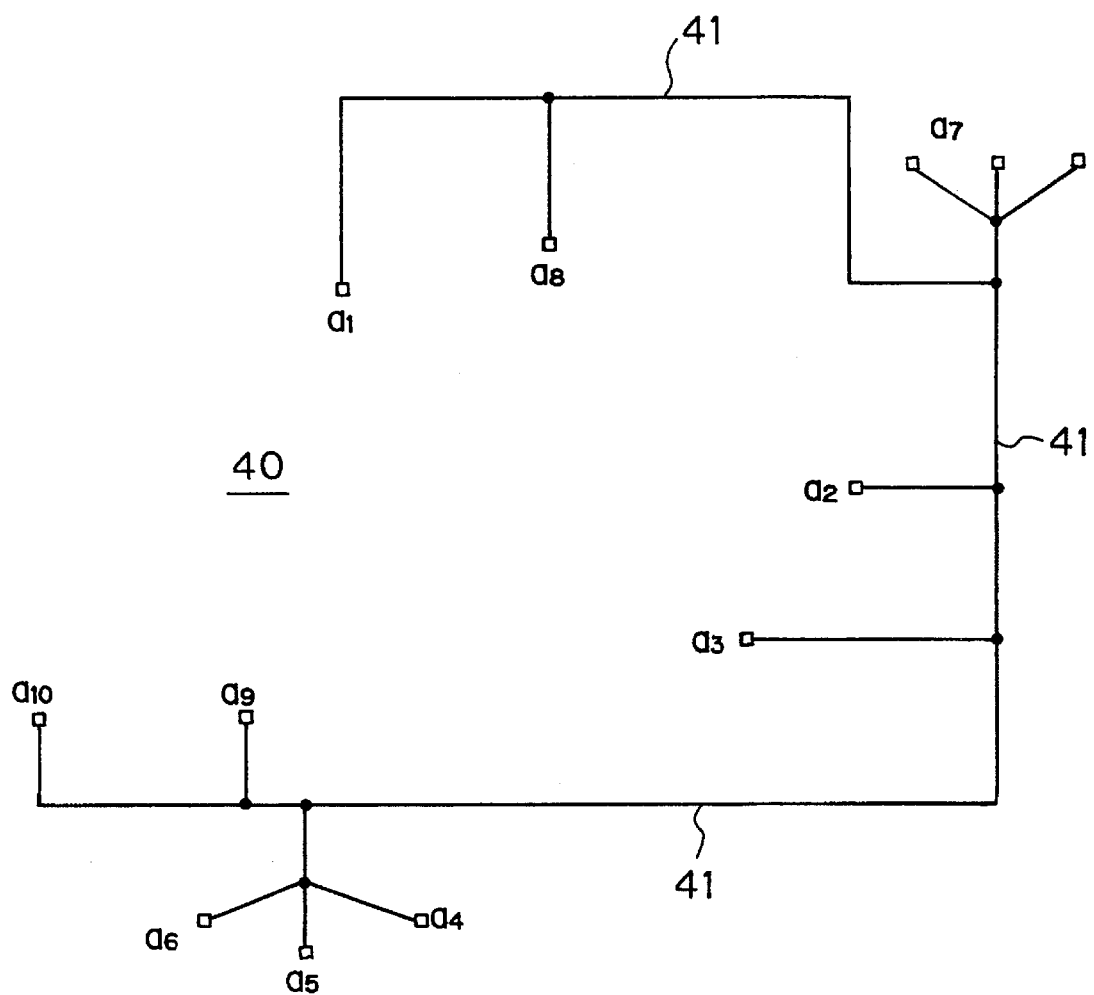
FIG. 6 is a wiring diagram of an anti-lock braking system which constitutes the main harness.

As shown in FIG. 6, the dedicated circuit 40 for an anti-lock braking system includes: a circuit group 41 having a power source circuit, a grounding circuit, and a system signal circuit; terminals $a_1$ through $a_6$ to be inserted into devices $A_1$ through $A_6$ which are associated with the anti-lock braking system, including an anti-lock braking unit, an alarm lamp and so on which are connected to the corresponding circuits in the circuit group 41; a terminal $a_7$ to be inserted into the connector $J_1$ which in turn to be joined to the engine compartment harness; a terminal $a_8$ to be inserted into $J/C_2$; a terminal $a_9$ to be inserted into $J/C_3$; and a terminal $A_{10}$ to be inserted into $J/C_4$.

Figure 7:
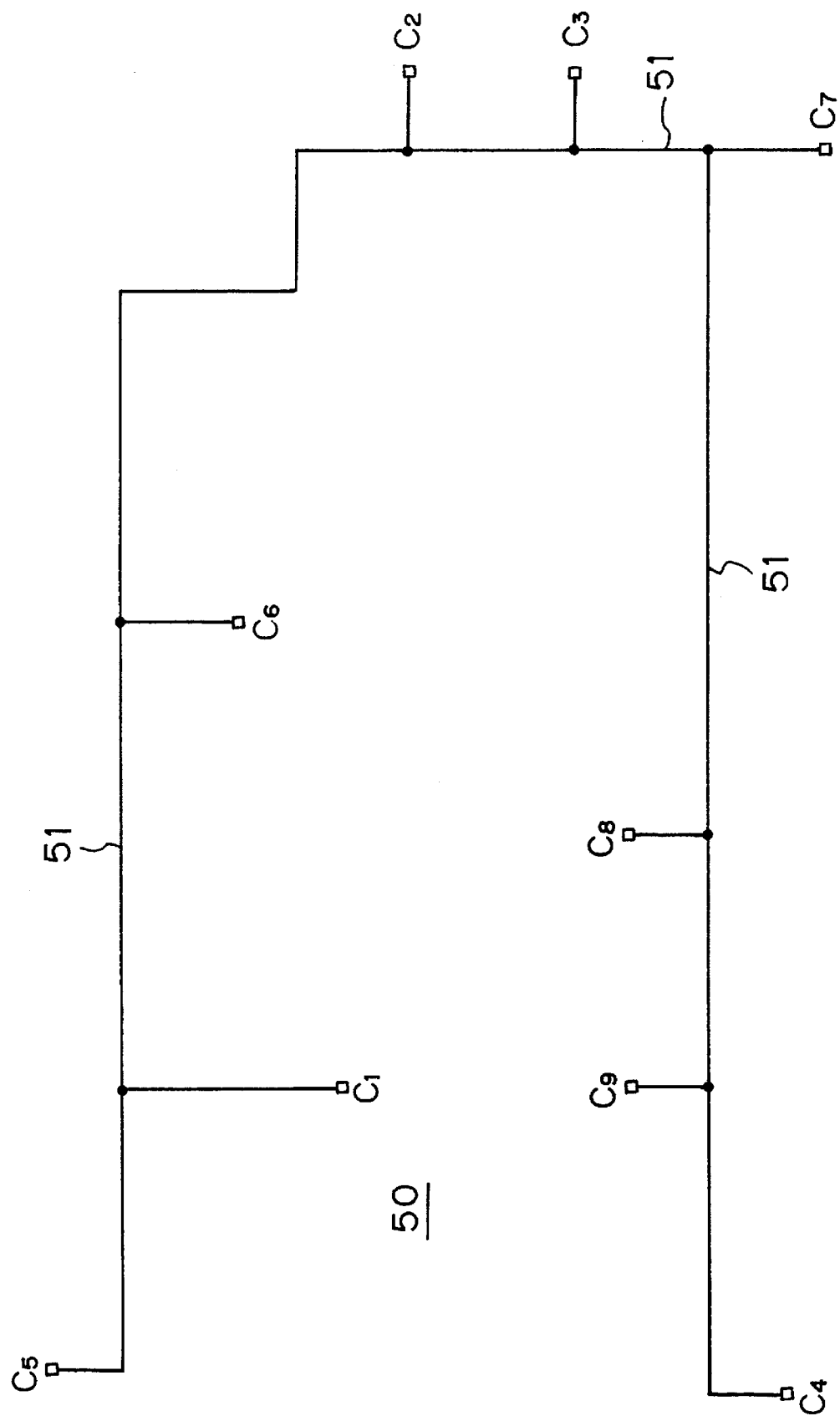
FIG. 7 is a wiring diagram of a keyless entry system which constitutes the main harness.
Figure 8:
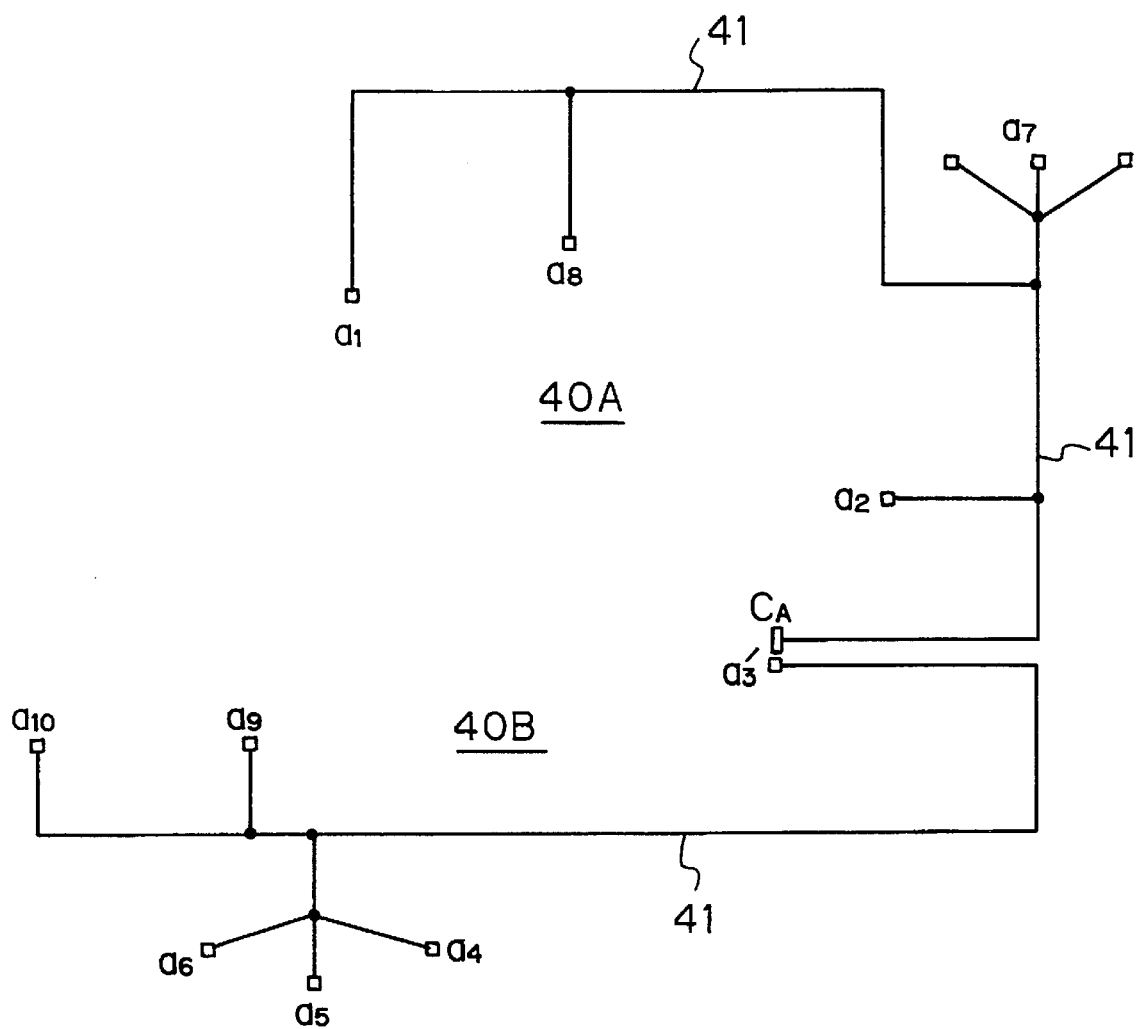
FIG. 8 is a wiring diagram of the anti-lock braking system shown in FIG. 6 which is divided into sub circuits.

As shown in FIG. 7, the dedicated circuit 50 for the keyless entry system includes: a circuit group 51 having a power source circuit, a grounding circuit, and a system signal circuit; terminals $C_1$ through $C_4$ to be inserted into devices $C_1$ through $C_4$ which are associated with the keyless entry system, including a keyless entry unit, a keyless entry switch, a keyless entry door and so on which are connected to the corresponding circuits in the circuit group 51; a terminal $c_5$ to be inserted into $J/C_1$; a terminal $c_6$ to be inserted into $J/C_2$, a terminal $c_7$ to be inserted into the connector $J_3$ which in turn to be joined to the trunk compartment harness; a terminal $c_8$ to be inserted into $J/C_3$; and a terminal $c_9$ to be inserted into $J/C_4$.

This common circuit and the dedicated circuits respectively contain only the circuits associated with the common electrical equipment and the selectable electrical systems and do not contain any other circuits.

To combine the common circuit 10 with the dedicated circuits 20 through 50 for the respective electrical systems to construct the main harness, the corresponding portions of the circuit groups of the respective circuits are laid parallel to each other, the terminals of the dedicated circuits for the respective electrical systems are one-step inserted into the corresponding connectors $J_1$ through $J_4$ and $J/C_1$ through $J/C_4$ of the common circuit, and the circuit groups are bundled by means of tape or covered with a tube, as shown in FIG. 1.

To construct a main harness for an appliance which contains a combination of two or three electrical systems, the dedicated circuits for these two or three electrical systems are joined to the common circuit.

A main harness for an appliance which contains electrical systems other than the above-mentioned can be constructed in the same manner.

Where the wiring structure of the common circuit or any of the dedicated circuits for the selectable electrical systems is complicated, the circuit may be divided into a plurality of sub circuits which can be one-step joined to each other using a connector and a terminal. For example, the circuit for an anti-lock braking system shown in FIG. 6 may be divided into a sub circuit 40A having a connector $c_A$ to be connected to the anti-lock braking sensor $A_s$, and a sub circuit 40B having a terminal $a_s'$ to be one-step connected to the connector $C_A$. The degree of division of the circuit into sub circuits depends on the volume of the circuit group in the common circuit or the dedicated circuits for the electrical systems.

Also, the common circuit may be separated into basic circuits each constitutes a circuit for each basic electric equipment of the appliance.

Next, the method of manufacturing the main harness will be described below.

First, a predetermined number of wires are cut to respective predetermined lengths to prepare circuit elements for forming each of the common circuit 10 and the dedicated circuits 20, 30, 40 and 50 for the electrical systems, and the connectors $J_1$ through $J_3$, the grounding points $EP_1$ through $EP_3$, the joint connectors $J/C_1$ through $J/C_4$, the terminals $t_1$ through $t_9$, $h_1$ through $h_9$, $e_1$ through $e_9$, $a_1$ through $a_{10}$ and $c_1$ through $c_9$ are mounted on predetermined positions in cut out wires to construct the circuits shown in FIGS. 2, 4, 5, 6 and 7. Mounting of the terminals and connectors and connection between the wires can be performed on fixed type working tables and/or conveyor type working tables which can be circulated. Since the wire harness is divided into the common circuit and the respective dedicated circuits for the electrical systems, assembly operation can be performed on small working tables. Also, the working unit can be made small, thus reducing the occurrence of mis-connected wires and improving workability.

Where the common circuit or any of the dedicated circuits for the electrical systems has a complicated wiring structure, the circuit can be divided into a plurality of sub circuits which can be one-step connected to each other by means of a connector and a terminal.

Figure 9:
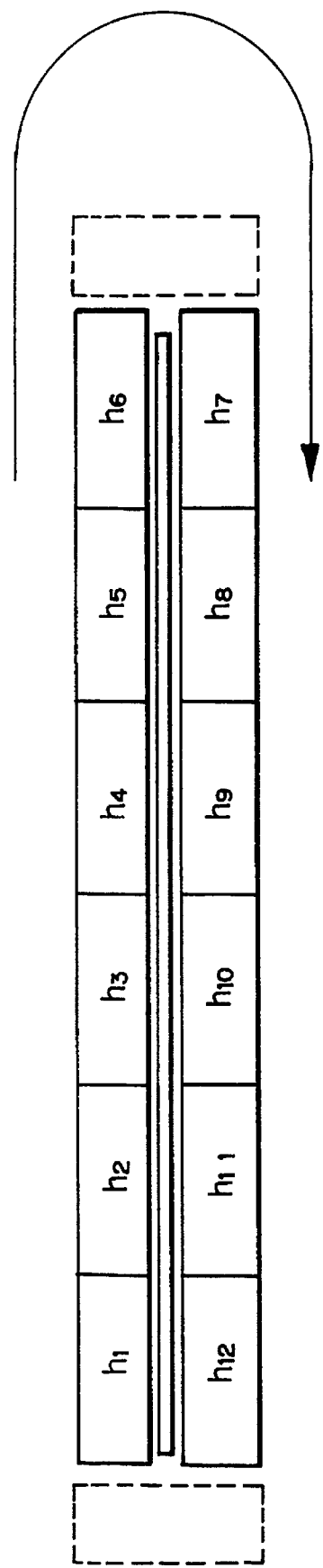
FIG. 9 illustrates an example of a conveyor production line used to manufacture a wire harness according to the present invention.

Next, the thus-arranged circuits or sub circuits are wired according to wiring diagrams on drawing boards (on which the wiring diagrams for the circuits or sub circuits and the wiring jigs are provided) provided on the conveyor type working tables, and the connectors and the corresponding terminals are joined to each other to construct the main harness. FIG. 9 illustrates a conveyor type production line consisting of 12 working tables. For example, the sub circuits of the common circuit 10 may be assembled in sequence on the working tables $h_1$ through $h_5$ to complete the common circuit, the dedicated circuits 20, 30, 40 and 50 for the corresponding electrical systems are assembled on the working tables $h_8$ through $h_9$, respectively, inspection and mounting of external parts, including taping on a wire bundle, covering the bundle with a tube and mounting of fuses, are conducted on the working tables $h_{10}$ to $h_{11}$, and the final product is obtained on the working table $h_{12}$.

A different type of wire harness can be produced by suitably selecting the dedicated circuits for the electrical systems which are incorporated on the working tables $h_6$ through $h_9$. Thus, different types of wire harnesses can be produced using the single conveyor line, and the requirements for the small-scale production of various goods can therefore be further fulfilled.

Furthermore, the working tables may be divided into three groups of $h_1$ through $h_9$, $h_4$ through $h_6$ and $h_7$ through h9. In that case, the sub circuits of the common circuit and the sub circuits of the dedicated circuit are assembled in sequence in the first two working table groups $h_1$ through $h_3$ and $h_4$ through $h_6$, and the common circuit and the dedicated circuit for the electrical system are completed at the same time on the final group $h_7$ through $h_9$.

As the car model changes, the wiring structure of the same electrical system changes. In that case, wire harnesses for different car models can be formed on the same drawing board by providing drawing diagrams and jigs (with or without changing colors thereof) corresponding to many car models on the drawing board provided on a single working table and by conducting wiring and connection using a selected wiring diagram and jig. Thus, it is not necessary for the wiring diagram to be replaced for each different car model. Consequently, preparation for manufacture is made easy, and working efficiency is improved. Furthermore, since each of the circuits or sub circuits comprises a small circuit group, wiring can be conducted easily on the drawing board in the manufacture of a wire harness according to the present invention. Furthermore, since the number of required jigs is reduced, it is possible to place, on a single working table, wiring diagrams and jigs for the common circuits and electrical system circuits corresponding to a plurality of car models.

In the thus-arranged wire harness which is made up of a combination of a common circuit and respective dedicated circuits one for each of the selectable electrical systems, production control thereof is easy and mass production or changes in production can be readily dealt with. There are 16 types of wire harnesses, as shown in Table 1, when there are, for example, four electrical systems, including the four wheel drive system, the keyless entry system, the anti-lock braking system and electronic control suspension system, to be contained in the wire harness.

TABLE 1

| Harness | Common circuit | Four wheel drive | Keyless entry | Anti-lock braking | Electronic control suspension |
|---|---|---|---|---|---|
| A | Contained | Contained | Not contained | Not contained | Not contained |
| B | Contained | Contained | Not contained | Not contained | Contained |
| C | Contained | Contained | Not contained | Contained | Not contained |
| D | Contained | Contained | Contained | Not contained | Not contained |
| E | Contained | Contained | Not contained | Contained | Contained |
| F | Contained | Contained | Contained | Contained | Not contained |
| G | Contained | Contained | Contained | Not contained | Contained |
| H | Contained | Contained | Contained | Contained | Contained |
| I | Contained | Not contained | Not contained | Not contained | Not contained |
| J | Contained | Not contained | Not contained | Not contained | Contained |
| K | Contained | Not contained | Not contained | Contained | Not contained |
| L | Contained | Not contained | Contained | Not contained | Not contained |
| M | Contained | Not contained | Not contained | Contained | Contained |
| N | Contained | Not contained | Contained | Contained | Not contained |
| O | Contained | Not contained | Contained | Not contained | Contained |
| P | Contained | Not contained | Contained | Contained | Contained |

Whereas 16 types of harnesses A through P formed by combinations of the four electrical systems must be conventionally controlled, the number of types that must be production controlled in this embodiment is 5, including the common circuit and four dedicated circuits, making production control easy.

Furthermore, since the manufacture of a wire harness concentrates on the manufacture of a common circuit and dedicated circuits one for each of the selectable electrical systems, the production lot can be increased, thus improving productivity.

For example, Table 2 shows the relation between the production quantity of harnesses A through P and the production quantity of the common circuit and dedicated circuits for the electrical systems which are required for the production of these harnesses.

TABLE 2

(Unit: Set)

| Harness | Planned Production quantity | Common circuit | Four wheel drive | Keyless entry | Anti-lock braking | Electronic control suspension |
|---|---|---|---|---|---|---|
| A | 100 | 100 | 100 | 0 | 0 | 0 |
| B | 20 | 20 | 20 | 0 | 0 | 20 |
| C | 10 | 10 | 0 | 10 | 0 | 0 |
| D | 130 | 130 | 130 | 130 | 0 | 0 |
| E | 5 | 5 | 5 | 0 | 5 | 5 |
| F | 10 | 10 | 10 | 10 | 10 | 0 |
| G | 20 | 20 | 20 | 20 | 0 | 20 |
| H | 40 | 40 | 40 | 40 | 40 | 40 |
| I | 100 | 100 | 0 | 0 | 0 | 0 |
| J | 20 | 20 | 0 | 0 | 0 | 20 |
| K | 10 | 10 | 0 | 0 | 10 | 10 |
| L | 130 | 130 | 0 | 130 | 0 | 0 |
| M | 5 | 5 | 0 | 0 | 5 | 5 |
| N | 10 | 10 | 0 | 10 | 10 | 10 |
| O | 20 | 20 | 0 | 20 | 0 | 20 |
| P | 40 | 40 | 0 | 40 | 40 | 40 |
| Total | 670 | 670 | 325 | 410 | 120 | 180 |

In Table 2, the left side planned production quantity denotes an example of the number of harnesses A through P to be produced. Since every harness A through P includes a common circuit, the number of the common circuits of these harnesses is the same as the planned quantity of the harnesses. However, since the existence or non-existence of the dedicated circuit for electrical systems depends on the type of the harness, the number of the dedicated circuits for each electrical system shown in Table 2 is the same as the planned quantity when a harness contains such an electrical system, and is zero when a harness does not contain such a system. Whether or not a specific electrical system is included in harnesses A through P is determined from Table 1. From Table 2, it will be understood that the production lot is determined by the total number of the common circuit and the dedicated circuits for the electrical systems, and it is relatively high when designed according to the present invention.

More specifically, in a conventional production method based on the design for each of the individual harness numbers, the maximum quantity of the production lot is 130 for harnesses D and L while the minimum quantity thereof is 5 for harnesses E and M. However, in the production method according to this embodiment, the maximum quantity of the production lot is 670 for the common circuit while the minimum quantity thereof is 120 for the dedicated circuit of an anti-lock braking system. Thus, mass production can be performed using the production facility, such as a conveyor type production line.

Furthermore, an increase or decrease in the production quantity is cancelled due to the common use of the common circuit and dedicated circuits for the electrical systems, the influence of changes in production is lessened. If changes in the production quantities of harnesses A through P, for example, as shown in Table 3 do occur, the production quantities of the common circuit and dedicated circuits change as follows:

TABLE 3

(Unit: Set)

| Harness | Planned quantity | Quantity to be altered | Common circuit | Four wheel drive | Keyless entry | Anti-lock braking | Electronic control suspension |
|---|---|---|---|---|---|---|---|
| A | 100 | +20 | +20 | +20 | 0 | 0 | 0 |
| B | 20 | −20 | −20 | −20 | 0 | 0 | −20 |
| C | 10 | +40 | +40 | 0 | +40 | 0 | 0 |
| D | 130 | −10 | −10 | −10 | −10 | 0 | 0 |
| E | 5 | +5 | +5 | +5 | 0 | +5 | +5 |
| F | 10 | +20 | +20 | +20 | +20 | +20 | 0 |
| G | 20 | −10 | −10 | −10 | −10 | 0 | −10 |
| H | 40 | −30 | −30 | −30 | −30 | −30 | −30 |
| I | 100 | −50 | −50 | 0 | 0 | 0 | 0 |
| J | 20 | −20 | +20 | 0 | 0 | 0 | +20 |
| K | 10 | +10 | +10 | 0 | 0 | +10 | +10 |
| L | 130 | +20 | +20 | 0 | +20 | 0 | 0 |
| M | 5 | +5 | +5 | 0 | 0 | +5 | +5 |
| N | 10 | −5 | −5 | 0 | −5 | −5 | −5 |
| O | 20 | +10 | +10 | 0 | +10 | 0 | +10 |
| P | 40 | −20 | −20 | 0 | −20 | −20 | −20 |
| Total | 670 | +5 | +5 | −25 | +15 | −15 | −35 |

In Table 3, since the every harness A through P includes a common circuit, the number of the common circuits to be altered is the same as the quantity of the harnesses to be altered. Also, the number of the dedicated circuits for each electrical system to be altered is the same as the quantity of the harnesses to be altered when the harness does not contain a system. Whether or not a specific harness includes such an electrical system is determined from Table 1, as stated above. From Table 3, it will be understood that variations in the production quantity, which is determined by the total number in the table, are relatively small if designed according to the present invention.

More specifically, whereas in a conventional production method based on an individual harness number, there are variations in the production quantity of the individual harness between the maximum value of +40 (harness C) and the minimum value of −50 (harness I), there are variations of the dedicated circuits only between the maximum value of +15 (the dedicated circuit for the keyless entry system) and the minimum value of −35 (the dedicated circuit for the electronic control suspension system) in the production method of this embodiment, making manufacture easy. Particularly, there is only a slight change in the production quantity of the common circuit having a complicated circuit configuration.

In the above described embodiment, the combination of four electrical systems, i.e., a four wheel drive system, keyless entry system, anti-lock braking system and electronic control suspension system, of the main harness, which comprises one of the harness sections of the wire harness for vehicles, has been described. However, the present invention can also be applied to a combination of other electrical systems or to a harness other than the main harness, such as an engine compartment harness, cabin harness or front door harness. Also, the present invention can be applied to an appliance containing electrical systems other than wire harnesses for vehicles, such as industrial or household appliances.

As will be understood from the foregoing description, the wire harness and the wire harness manufacturing method according to the present invention assure easy production control, high production efficiency and allow variations in production quantity or design to be readily dealt with.

What is claimed is:

1. A wire harness for an appliance, the appliance including a combination of a normally installed electrical equipment and at least one electrical system selected from a plurality of selectable electrical systems, said wire harness comprising:

a common circuit, and at least one dedicated circuit selected from a plurality of dedicated circuits configured for respective selectable electrical systems, wherein said common circuit includes a circuit group of a power source circuit, a grounding circuit and a signal circuit associated with normally installed electrical equipment and each of said dedicated circuits includes a circuit group of a power source circuit, a grounding circuit and a system signal circuit associated with one of the selectable electrical systems, and wherein said common circuit and the dedicated circuits of the selected electrical systems are detachably joined to each other via a branch connector.

2. A wire harness according to claim 1, wherein said common circuit and each of said dedicated circuits for each of the selectable electrical systems are divided into a plurality of sub circuits which can be joined to each other by means of a connector and a terminal.

3. A wire harness according to claim 1, wherein said appliance is a vehicle.

4. A wire harness according to claim 3, wherein said wire harness is one of a main harness, an engine compartment harness, a cabin harness and a front door harness.

5. A wire harness according to claim 4, wherein said selectable electrical system includes at least one of a four wheel drive system, a keyless entry system, an anti-lock braking system and an electronic control suspension system.

6. A wire harness according to claim 1, wherein said appliance is one of an industrial appliance and a household appliance.

7. A method of manufacturing a wire harness for an appliance whose circuit differs depending on a combination of selectable electrical systems, said method comprising the steps of:

separately forming a common circuit by forming a circuit group of a power source circuit, a grounding circuit and a signal circuit associated with normally installed electrical equipments, and each of dedicated circuits by forming a circuit group of a power source circuit, a grounding circuit and a system signal circuit associated with one of the selectable electrical systems, each of said dedicated circuits being configured according to a respective selectable electrical system; and detachably joining said common circuit to said dedicated circuits of the selected electrical systems using at least one branch connector.

8. A wire harness manufacturing method according to claim 7, wherein said common circuit and each of said dedicated circuits for each of the selectable electrical systems are divided into a plurality of sub circuits which can be joined to each by means of a connector and a terminal to form the wire harness.

9. A wire harness manufacturing method according to either of claims 7 or 8, wherein said appliance is a vehicle.

10. A wire harness manufacturing method according to claim 9, wherein said wire harness is one of a main harness, an engine compartment harness, a cabin harness and a front door harness.

11. A wire harness manufacturing method according to claim 10, wherein said selectable electrical system includes at least one of a four wheel drive system, a keyless entry system, an anti-lock braking system and an electronic control suspension system.

12. A wire harness manufacturing method according to either of claims 7 or 8, wherein said appliance is one of an industrial appliance and a household appliance.

13. A wire harness manufacturing method according to either of claims 7 or 8, wherein said working tables are conveyor type working tables being circulated.

14. A wire harness manufacturing method according to claim 13, wherein connection of the wire harness of said common circuit is completed on part of a plurality of said working tables, while connection of the wire harness of said dedicated circuits is completed on the remaining working tables.

15. A wire harness manufacturing method according to claim 13, wherein said working tables are divided into a plurality of working table groups, the wire harnesses of said common circuit and said dedicated circuits are sequentially assembled in each group of said working tables, and the assembling of the wire harnesses of said common circuit and said dedicated circuits are completed at the same time on the final group of said working tables.

* * * * *